United States Patent [19]
Baxter

[11] Patent Number: 5,870,586
[45] Date of Patent: Feb. 9, 1999

[54] CONFIGURATION EMULATION OF A PROGRAMMABLE LOGIC DEVICE

[75] Inventor: Glenn A. Baxter, Ben Lomond, Calif.

[73] Assignee: Xilinx, Inc., San Jose, Calif.

[21] Appl. No.: 594,933

[22] Filed: Jan. 31, 1996

[51] Int. Cl.[6] .............................. G06F 9/455; G06F 17/50
[52] U.S. Cl. ........................................................ 395/500
[58] Field of Search .................... 395/500; 364/488–491, 364/578

[56] References Cited

U.S. PATENT DOCUMENTS

| | | | |
|---|---|---|---|
| 5,267,146 | 11/1993 | Shimizu et al. | 364/512 |
| 5,517,646 | 5/1996 | Piccirillo et al. | 395/651 |
| 5,572,716 | 11/1996 | Asano et al. | 395/500 |

OTHER PUBLICATIONS

"The XC5200 LCA Family Technical Data Book" Oct. 1995 (Referenced as XC5200 TM FPGA Data Sheet) Available from Xilinx, Inc. 2100 Logic Drive, San Jose, CA.

"The Programmable Logic Data Book", available from Xilinx, Inc., 2100 Logic Drive, San Jose, CA 95124, 1994, pp. 2–25 through 2–31.

"The Hardwire Data Book", available from Xilinx, Inc., 2100 Logic Drive, San Jose, CA 95124, 1994, pp. 2–23 through 2–25.

"The Programmable Logic Data Book", available from Xilinx, Inc., 2100 Logic Drive, San Jose, CA 95124, 1994, pp. 2–5 through 2–46.

"The XC5200 Logic Cell Array Family Technical Data Booklet" Oct. 1995 (referenced as XC5200™ FPGA Data Sheet) available from Xilinx, Inc., 2100 Logic Drive, San Jose, CA 95124.

"The Programmable Logic Data Book", available from Xilinx, Inc., 2100 Logic Drive, San Jose, CA 95124, 1994, pp. 2–7 through 2–46.

"The Programmable Logic Data Book", available from Xilinx, Inc. 2100 Logic Drive, San Jose, CA 95124, 1994, pp. 2–26.

*Primary Examiner*—Kevin J. Teska
*Assistant Examiner*—Ayni Mohamed
*Attorney, Agent, or Firm*—Kent Richardson; Jeanette S. Harms

[57] ABSTRACT

A configuration emulation circuit generates configuration signals to emulate a Programmable Logic Device (PLD) in a configuration timing relationship and a configuration protocol relationship between a programming circuit and the PLD. The circuit includes a first circuit to emulate the PLD in the configuration timing relationship. The circuit also includes a second circuit to emulate the PLD in the configuration protocol relationship. The second circuit is coupled to receive a configuration mode signal and is responsive to the configuration mode signal.

4 Claims, 5 Drawing Sheets

CONFIGURATION EMULATION OF A PROGRAMMABLE LOGIC DEVICE

BACKGROUND OF THE INVENTION

1. Field of the Invention

This invention relates to the field of circuit design. In particular, the invention relates to a circuit and method for maintaining the configuration process in a mask programmed integrated circuit implementation of a circuit design for a programmable logic device.

2. Description of the Related Art

Programmable Logic Devices (PLDs) allow circuit designers to program the PLDs to perform the function of a particular circuit design. Examples of programmable logic devices are Field Programmable Gate Arrays (FPGAs) and Erasable Programmable Logic Devices (EPLDs).

Random Access Memory (RAM) based PLDs use a configuration process to allow a programming circuit to program the PLD to perform the function of a particular circuit design. Non-RAM based PLDs use a similar configuration process. The configuration process uses serial and/or parallel communications between a programming circuit and the PLD. Thus, a configuration timing relationship and a configuration protocol relationship exist between the PLD and the programming circuit. This configuration timing relationship is the time from when power is applied to the PLD to immediately before the PLD is ready to function as the particular circuit design. The configuration protocol relationship is the signalling convention used between the programming circuit and the PLD during the configuration of the PLD.

In an XC4000™ FPGA PLD from Xilinx, Inc., of San Jose, Calif., the configuration mechanism begins after the power supply has reached a certain level (e.g., 3.5 volts). The power reaching a specified level then triggers a specific set of phases. The 1994 Xilinx Data Book, page 2–25 through page 2–31, describes the configuration process for the XC4000 FPGA product family.

In some cases, where the economies of scale warrant, a designer will want to target a circuit design for a different implementation technology. That is, a designer will want to convert a circuit design in a technology (e.g., mask programmed integrated circuit technology) other than in a programmable logic device. A Mask Programmed Integrated Circuit (MPIC) version reduces the silicon area needed to implement the circuit design and is therefore less expensive. This conversion process may be to a simple mask programmed version of the PLD, or a totally different representation; but the user logic functionality is maintained. One example of such a process is described in U.S. Pat. No. 5,550,839 which issued Aug. 27, 1996, entitled, "Mask-Programmed Integrated Circuits Having Timing and Logic Compatibility to User-Configured Logic Arrays."

A MPIC of a PLD does not have a configuration timing relationship nor a configuration protocol relationship because the MPIC is already configured and therefore already programmed. In contrast, the PLD must complete the entire configuration process prior to the commencement of the functional operation of the particular circuit design.

Therefore, one of the problems encountered by designers who convert their circuit designs to another technology is that the configuration timing relationship is not the same for the target technology. A second problem is that the configuration protocol relationship is not maintained. While these two problems may not affect the PLD's circuit design implementation logic functionality, they do affect the integration of the MPIC into the system. If the configuration timing relationship is not maintained, system problems may result that must be solved prior to the introduction of the mask programmed version into the final system. Further, if the configuration protocol relationship is not maintained, the entire system may not become operational. For example, the designer may have to alter the programming circuit or the software that executes in the system. A designer may not want to modify any other part of the system to migrate to a new target technology because this adds additional costs to the design process. The modification of the system may also add to the time it takes to release the system to the market using the target technology. The modification introduces the possibility of design mistakes into the system.

One partial solution to the configuration timing relationship problem is to include a power-on reset circuit in the target technology integrated circuit, thereby ensuring that the integrated circuit will be held in a reset state for a period of time until after the applied power becomes stable. This mechanism is referred to as "Power-On-Reset" (POR). However, the POR circuit does not completely solve the problem because the system using the target technology will still have to fully support the remainder of the configuration timing and configuration protocol relationships. If the system was not originally designed to, or is not capable of, supporting POR then the system will have to be redesigned for the target technology.

Xilinx, Inc. produces the XC4300 HardWire™ integrated circuit which supports an alternative configuration mechanism referenced as "Instant-On." This mechanism is documented in the Xilinx HardWire Data Book, page 2–23 through 2–25, 1994. However, the instant-on feature largely ignores the issues of the configuration protocol relationships.

Therefore, what is needed is a better solution to both the configuration timing relationship problem and the configuration protocol relationship problem. The solution should reduce, or even remove, the need to redesign the rest of the system.

SUMMARY OF THE INVENTION

A circuit and method of emulating the configuration process of a programmable logic device is described.

In one embodiment, the configuration emulation circuit generates configuration signals to match the configuration protocol relationship. The embodiment maintains a compatibility with the configuration protocol features of the PLD that is being converted. Further, the embodiment emulates multiple configuration modes of a PLD. Specifically, a PLD may have a designer settable option to control what kind of configuration protocol relationship to use during the configuration process. In another embodiment, the configuration emulation circuit also maintains the configuration timing relationship.

In another embodiment, a configuration emulation circuit is included for each configuration mode supported. The embodiment multiplexes the different configuration emulation circuits depending upon the type of configuration mode used by the system, and thereby allowing the embodiment to easily emulate different configuration modes of a PLD.

Another embodiment includes a merged configuration emulation circuit. The merged configuration emulation circuit includes a merged logic block and mode specific logic blocks. The merged logic block includes logic needed to support common functions in the configuration modes supported in the embodiment. The mode specific logic blocks support the functions that are specific to the emulation of a particular configuration mode in the embodiment.

Although many details have been included in the description and the figures, the invention is defined by the scope of the claims. Only limitations found in those claims apply to the invention.

BRIEF DESCRIPTION OF THE DRAWINGS

The figures illustrate the invention by way of example, and not limitation. Like references indicate similar elements.

Figure 1:
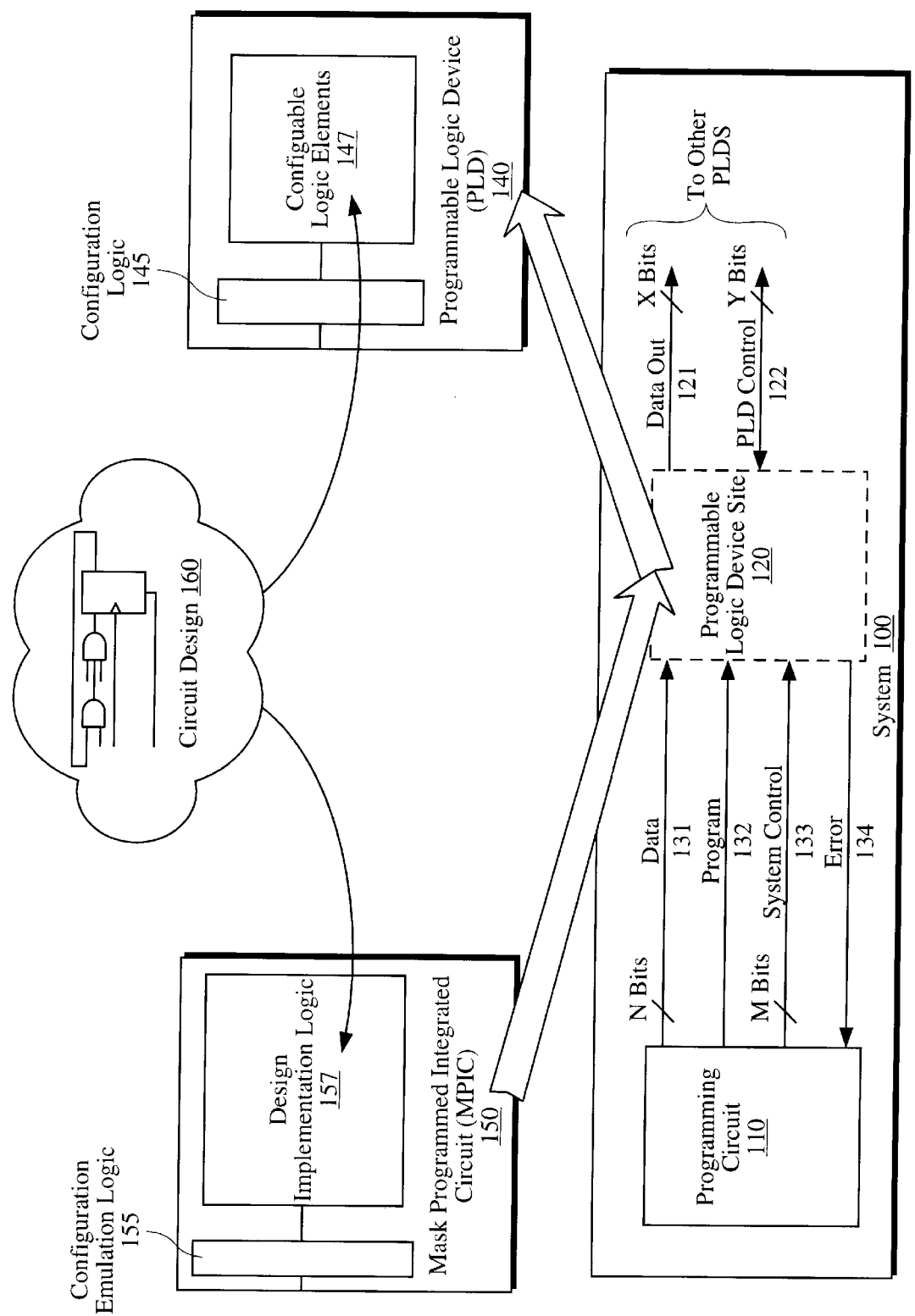
FIG. 1 illustrates a system where a MPIC implementation of a circuit design has been substituted for a PLD.

DETAILED DESCRIPTION OF THE DRAWINGS
A System Including A Configuration Emulation Circuit FIG. 1 illustrates an example system 100 where a programmable logic device (PLD) 140 implementation of a circuit design 160 is being replaced by a mask programmed integrated circuit (MPIC) 150 implementation of the circuit design 160. In the following discussion, the PLD 140 refers to the general class of PLDs and is not specifically restricted to a particular type or family of PLDs.

The system 100 includes a programming circuit 110 which communicates, via a number of busses, with a device mounted in the programmable logic device site 120. The programming circuit 110 generates the configuration data for programming the PLD 140 when the PLD 140 is mounted in the programmable logic device site 120. The programming circuit 110 generates the same configuration data for the MPIC 150 even though the MPIC 150 is already programmed.

In one embodiment, the PLD includes an array of configurable logic elements 147 that are programmed to perform the functions of the circuit design 160. The PLD 140 also includes configuration logic 145. The configuration logic 145 supports the configuration of the PLD 140. The programming circuit 110 uses the following busses to configure the PLD 140: a data bus 131, a program bus 132, a system control bus 133, and an error bus 134. The programming circuit 110 communicates configuration data via the N bit data bus 131, wherein N is one for serial configuration mode and greater than one for parallel configuration mode. The program bus 132 signals to the device in the programmable logic device site 120 that the programming circuit is to be programmed and in which mode. The M bit system control bus 133 is used during certain types of configuration modes (e.g., an address bus for master parallel mode). The error bus 134 indicates to the programming circuit 110 whether an error has occurred. Additionally, for some modes, the PLD 140 is responsible for programming other PLDs 140. To program these other PLDs 140, the data out bus 121 and the PLD control bus 122 are used by the PLD 140. The configuration timing relationship and the configuration protocol relationship on the busses between the programming circuit 110 and the device mounted in the programmable logic device site 120 are partially determined by the configuration mode used in the system.

One embodiment emulates the following configuration modes of the Xilinx, Inc. XC4000™ FPGA product family:

a slave serial mode, a master serial mode, a master parallel up mode, a master parallel down mode, an asynchronous peripheral mode, and a synchronous peripheral mode. The 1994 Xilinx Data Book, page 2–25 through page 2–46, describes the configuration modes for the XC4000™ FPGA product family. Another embodiment supports other configuration modes, such as, express mode (described in the XC5200™ FPGA data sheet from Xilinx, Inc.) and boundary scan. The following briefly describes each of these modes.

The slave serial mode is often used for PLDs 140 that depend on other PLDs 140 for their configuration. For slave serial mode, the PLD 140 accepts configuration data from a single bit wide data bus 131 and retransmits the data via a single bit data out bus 121 as needed. Various control signals are exchanged between the programming circuit 110 and the PLD 140 for controlling the startup function on the system control bus 133 (e.g., DONE, HDC and LDC as described in the 1994 Xilinx Data book at page 2–7 through page 2–46). If an error occurs during the configuration, the PLD 140 communicates the error to the programming circuit 110 on the error bus 134. The slave serial mode requires the programming circuit 110 to strobe the data into the PLD 140 via a configuration clock (part of the system control bus 133).

The master serial mode is often used for the first PLD 140 in a chain of PLDs 140. The chain of PLDs 140 are configured one after another. Additionally, the master serial mode is used where only one PLD 140 is configured. The master serial mode is similar to the slave serial mode except that in master serial mode, the PLD 140 drives a configuration clock signal to other slave devices via the PLD control bus 122 and to the programming circuit 110 via the system control bus 133. In one embodiment, the programming circuit 110 includes a PLD 140 in master serial mode, or another MPIC 150 emulating master serial mode.

The master parallel up mode is used where the programming circuit 110 includes a byte-wide EPROM (Erasable Programmable Read Only Memory). The programming circuit 110 initiates the program mode with the program bus 132. The EPROM is typically dedicated to configuring the PLD 140 but is not required to be. The PLD 140 generates addresses on an address bus (part of the system control bus 133) for the EPROM. Data from the EPROM arrive on the data bus 131.

The master parallel down mode is similar to the master parallel up mode except that the PLD 140 generates addresses starting from the maximum address (e.g., 0×FFFFFF) and counts down, instead of starting at the lowest address (e.g., 0×00000) and counting up.

The asynchronous peripheral mode supports an interface with a microprocessor. In the asynchronous peripheral mode, the PLD 140 acts as an asynchronous peripheral to the programming circuit 110. The data bus 131 is bi-directional and is used to send configuration data to the PLD 140 and to read status information from the PLD 140. Configuration errors can be signalled by the PLD 140 by the error bus 134.

The synchronous peripheral mode is similar to the asynchronous mode except that the programming circuit 110 drives a configuration clock (on the system control bus 133). The PLD 140 uses a number of control signals on the system control bus to control the flow of data on the data bus 131.

The express mode is used when fast configuration of multiple PLDs 140 is desired. The express mode is a parallel configuration mode for all the PLDs 140 in a chain of PLDs 140. The express mode is similar to the synchronous peripheral mode in that the configuration data is clocked in from the programming circuit 110 synchronously. Data is input to all the devices on the chain via the data inputs of the PLDs 140. A signal from the first PLD 140 in the chain is used by that PLD 140 to tell the next PLD 140 to begin reading the data inputs for its configuration data via the PLD control bus 122.

The IEEE 1149.1 boundary scan Test Access Port of the PLD 140 supports the boundary scan configuration mode. Any output data from the PLD 140 is sent through the internal boundary scan configuration chain of the PLD 140 then out through a Test Data Output pin to the system 100.

Returning to the example of FIG. 1, the PLD 140 is to be substituted by the lower cost MPIC 150. The MPIC 150 includes a design implementation logic 157 and a configuration emulation logic 155. The design implementation logic 157 implements the functions of the circuit design 160 which were previously implemented in the configurable logic elements 147. The configuration emulation logic 155 emulates some, or all, of the configuration logic 145 of the PLD 140. The configuration emulation logic 155 thus provides one embodiment of the invention with the advantage of emulating the configuration modes of a PLD 140. Thus, the MPIC can be directly substituted for the PLD 140 without causing the designer to redesign the system 100.

A Configuration Emulation Circuit

Figure 2A:
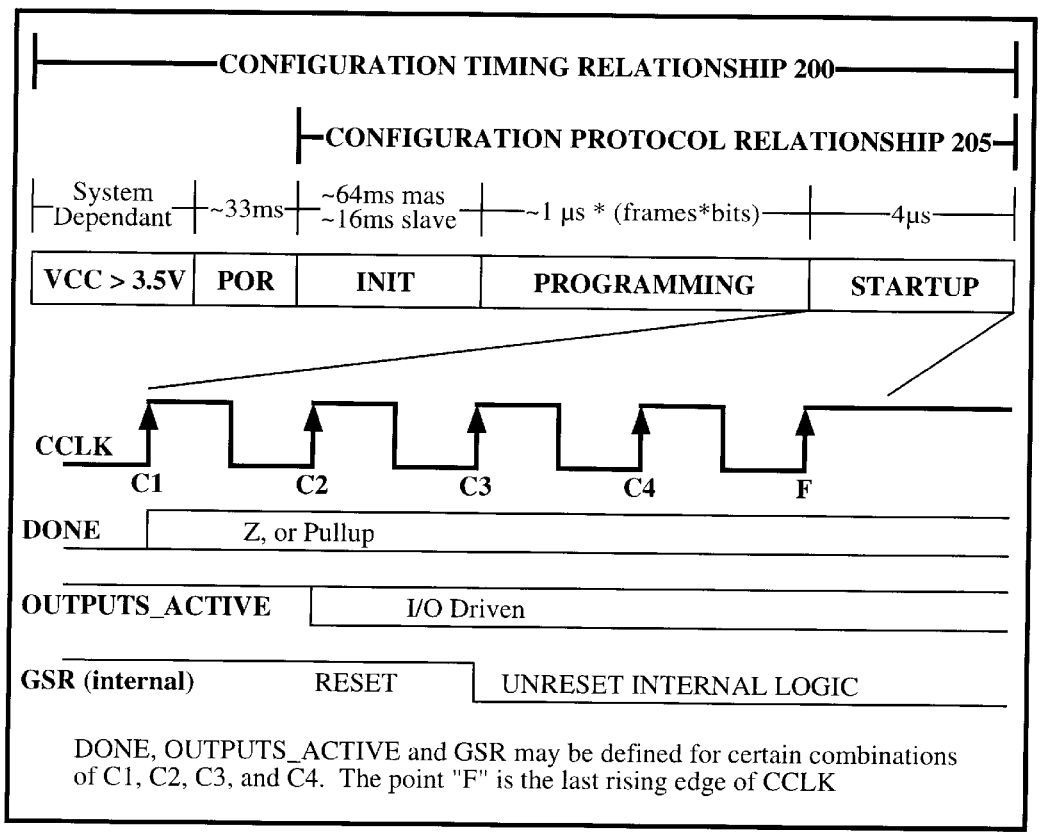
FIGS. 2A and 2B illustrate a configuration emulation circuit and an example of the configuration timing and the configuration protocol relationships of a PLD.
Figure 2B:
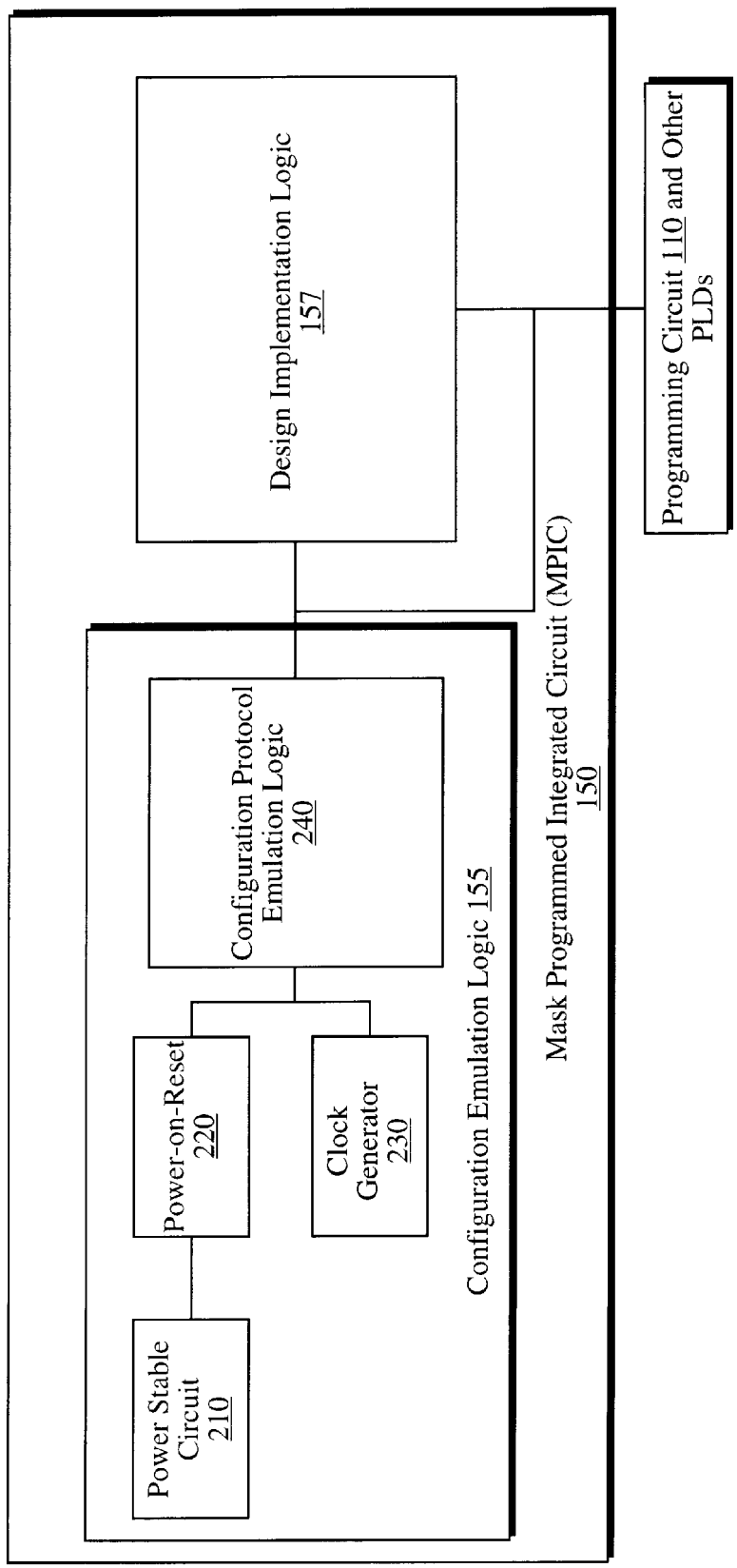

FIGS. 2A and 2B illustrate a more detailed version of the MPIC 150 of FIG. 1 and show the timing and protocol relationships between a PLD 140 and the programming circuit 110 from the power-on phase to the PLD active phase.

The configuration timing relationship 200 begins from the time that power is applied to the PLD 140 and continues until the PLD 140 is deemed functional (from the perspective of the rest of the system 100). The configuration timing relationship 200 include five time periods, corresponding to the five phases of the configuration process: a period associated with the power rail becoming stable, a period associated with the "Power-on-Reset" circuit, a period for an initialization phase of the PLD 140, a period for programming the PLD 140, and a period associated with the startup synchronization of the PLD 140 with other components in the system 100. The period associated with the power rail becoming stable is the time for the power to reach a stable value. The period associated with the power-on-reset circuit is approximately thirty-three milliseconds but can vary significantly. The initialization period allows the PLD 140 to reset the circuits in the PLD 140 (e.g., the memory devices for the configurable logic elements) and is approximately sixteen milliseconds for slave modes and sixty-four milliseconds for master modes. The configuration period is the period in which the PLD 140 is programmed. For one type of PLD 140, this is one microsecond times the number of frames of configuration data times the number of bits per frame of configuration data. Finally, the startup period is approximately four microseconds and is used to pull up the DONE signal, begin outputting information (OUTPUTS_ACTIVE), and pull the internal reset signal low (GSR).

The configuration protocol relationship 205 begins at the start of the initialization period and continues until the PLD 140 is deemed functional (from the perspective of the system 100). The configuration protocol relationship 205 represents the communications protocol requirements placed on the PLD 140 by the programming circuit 110 and any other devices that communicate with the PLD 140 during the entire configuration process.

Note that FIG. 2A is a general model that may have fewer or more delay periods depending on the configuration mode used by the PLD 140.

The configuration emulation logic 155 connects to the programming circuit 110, other slave PLDs 140 or MPICs, or other devices, and includes a number of circuits: a power stable circuit 210, a power-on-reset circuit 220, a clock generator 230, and a configuration protocol emulation logic 240. The power stable circuit 210 connects to the power-on-reset circuit 220. The power-on-reset circuit 220 connects to the clock generator 230 and the configuration protocol emulation logic 240. The configuration protocol emulation logic 240 connects to the design implementation logic 157 and communicates over the various busses of FIG. 1 with the programming circuit 110. Collectively, the circuits of the configuration emulation logic 155 emulate the PLD 140's part of the configuration timing relationship 200. Additionally, as part of the configuration emulation logic 155, the configuration protocol emulation logic 240 emulates the PLD 140's part of the configuration protocols with the programming circuit 110 and other system 100 devices.

The power stable circuit 210 ensures that the power source is stable for the MPIC 150. The power stable circuit 210 also emulates the time requirements for the power stable period of the PLD 140.

The power-on-reset circuit 220 performs the functions of the power-on-reset features of the PLD 140. Thus, the power-on-reset circuit 220 emulates the timing requirements for the power-on-reset period of the PLD 140. The power-on-reset circuit 220 also provides reset signals to the clock generator 230.

The clock generator 230 provides clock signals to the configuration protocol emulation logic 240. Also, the clock generator 230 also provides clock signals to other slave devices over the PLD control bus 122.

The configuration protocol emulation logic 240 emulates the configuration protocol responsibilities of a PLD 140 (during the configuration protocol relationship 205). In one embodiment, the configuration protocol emulation logic 240 permits multiple configuration emulation modes to exist. For example, one MPIC 150 can support multiple configuration modes of a PLD 140, thereby allowing designers to use the same MPIC 150 design in different configuration modes in the system 100. For example, assume two PLDs 140 are to be replaced by two MPICs 150. Also assume that each of the two PLDs 140 includes the same circuit design 160 and that the first PLD 140 operates in master serial mode, while the second PLD 140 operates in slave serial mode. By supporting multiple configuration modes in the configuration emulation logic 155, only one design of the replacement MPIC 150 need be fabricated. One MPIC 150 replaces the master serial mode PLD 140 and a second copy of the same MPIC 150 replaces the slave serial mode PLD 140. Similarly, the same circuit design 160 may be implemented in PLDs 140 in different systems 100. For example, one system 100 uses the PLD 140 in master serial mode, while another system 100 uses the PLD 140 in asynchronous peripheral mode. Because the configuration protocol emulation logic 240 supports multiple configuration modes, only one MPIC 150 need be fabricated. The new MPIC 150 can be used in either system without having to change either system.

A Multiplexed Mode Configuration Emulation Circuit

Figure 3A:
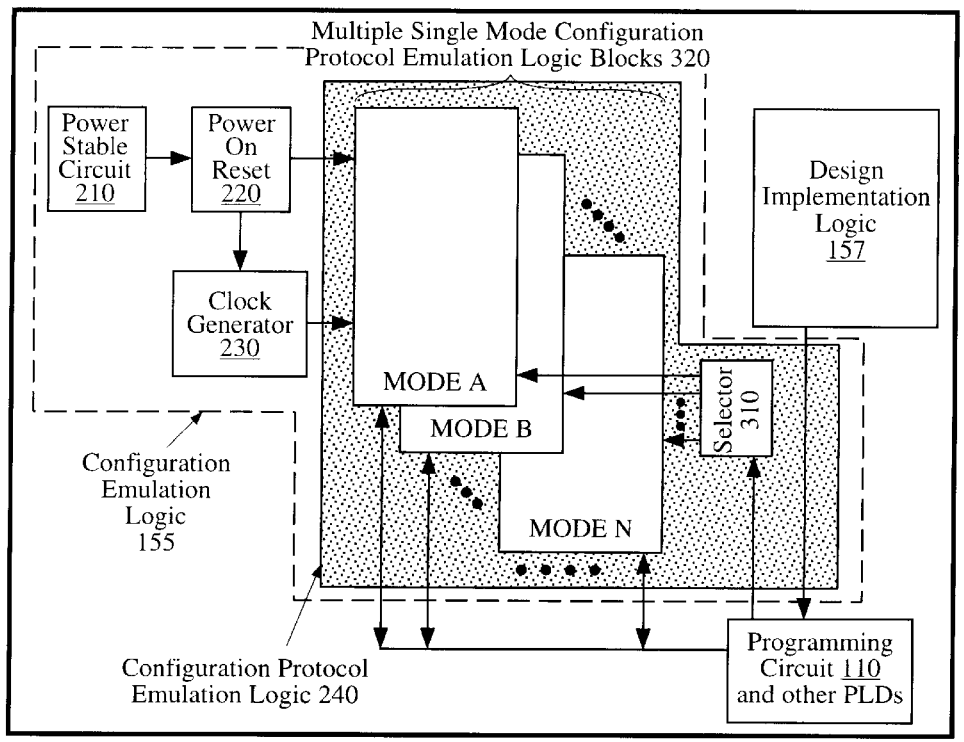
FIGS. 3A and 3B illustrate a multiplexed mode configuration emulation circuit.
Figure 3B:
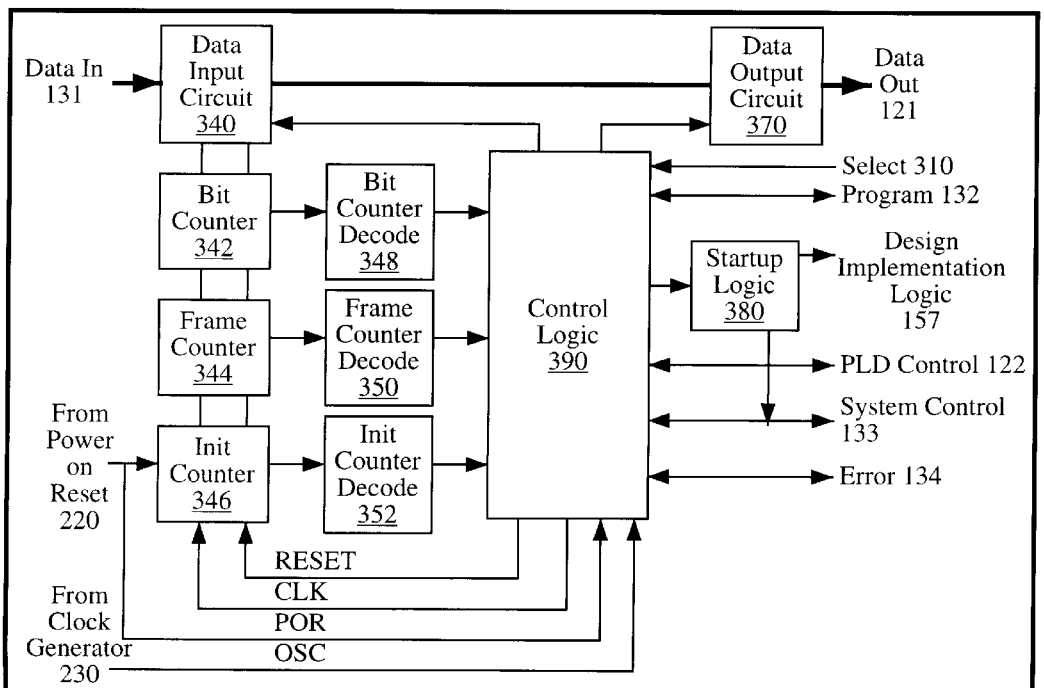

FIG. 3A illustrates an embodiment that emulates multiple configuration modes of a PLD 140. The configuration protocol emulation logic 240 of FIG. 3A includes multiple single mode configuration protocol emulation logic blocks 320. A selector 310 determines which mode is required by the programing circuit 110, then enables the appropriate corresponding logic block of the multiple single mode configuration protocol emulation logic blocks 320.

Each of the single mode emulation logic blocks emulates the configuration protocol responsibilities of a PLD 140 for a single configuration mode. For example, one single mode configuration protocol emulation logic block emulates slave serial mode, wherein another single mode configuration protocol emulation logic block emulates the configuration protocols for the master parallel up mode.

FIG. 3A includes a general model of a single mode configuration protocol emulation logic block 399. The block 399 includes the following circuits: a data input circuit 340, a bit counter 342, a bit counter decoder 348, a frame counter 344, a frame counter decoder 350, an init counter 346, an init counter decoder 352, a control logic 390, a startup logic 380 and a data output circuit 370. The control logic 390 connects to all of the other above referenced circuits and communicates information (e.g., INIT, and OSC-the output of the clock generator 230) with the programming circuit 110. The data input circuit 340 receives data from data bus 131 and communicates the data to the data output circuit 370. The data output circuit 370 controls the connection to the data out bus 121. Each of the decoders are connected to their corresponding counters and the control logic 390. The startup logic 380 connects to the design implementation logic 157 and the control logic 390.

Under the control of the control logic 390, the data input circuit 340 and the data output circuit 370, depending upon the specific mode, process serial or parallel data. In one embodiment, the data input circuit 340 includes a single D flip-flop for a bit from a serial stream of bits. In another embodiment, the data input circuit 340 includes an eight bit register to hold parallel data.

The init counter 346 counts the time needed for the initialization period. Thus, the init counter 346 is partially responsible for maintaining the configuration timing relationship 200 from a PLD 140 perspective.

The frame counter 344 and the bit counter 342 work together to count the number of frames and bits in an embodiment of the invention that emulates configuration modes of an FPGA, or similar PLD, that is programmed by frames and bits. The bit counter 342 counts the number of bits in a frame while the frame counter 344 counts the number of frames in the program data received from the programming circuit 110. In one embodiment, where header and footer bits are transmitted as part of the configuration data, these counters take into account these additional bits. The frame counter 344 and the bit counter 342 with the other circuits of the configuration emulation logic 155 emulate the PLD 140 in the configuration protocol relationship 205 during the programming period of the configuration timing relationship 200.

The startup logic 380 emulates the PLD 140's protocol for the startup period of the configuration protocol relationship 205 and completes the configuration timing relationship 200. The startup logic 380 generates signals (e.g., DONE, HDC and LDC) via the system control bus 133 to indicate to the programming circuit 110 that the emulated PLD 140's configuration process is complete.

The control logic 390 controls the circuits within the general model of a single mode configuration protocol emulation logic block 399. The control logic 390 provides clocks, clock enables, and resets for all the counters (e.g., CLK and RESET), controls the serialization of data (when dictated by the mode), manipulates the output data, handles counting the number of program bits read, and determines when the last programmed data bit has been read from the programming circuit 110.

The following describes a specific mode configuration protocol emulation logic block for the master serial mode of the XC4010™ FPGA. The total programming data stream, for a single XC4010 FPGA PLD 140, includes a forty bit header, a programming data segment of 226*788=178,088 bits (organized as 226 bits/frame and 788 frames), followed by an eight bit footer (described at page 2–26 of the 1994 Xilinx data book). Thus, there are a total of 178,136 bits that must be accounted for in the programming period of FIG. 2. The XC4010 FPGA supports connecting the FPGA in a chain to create a single data stream from the programming circuit 110 to the all the FPGAs in the chain. To support the chaining, the FPGAs need to retransmit the header to all the FPGAs in the chain. This header is the first forty bits of the data stream. Therefore, the control logic 390 ensures that the first forty bits of the configuration data are sent out by the data output circuit 370. Further, once the programming data segment for the FPGA being replaced by the particular MPIC 150 is received, the control logic 390 causes any remaining configuration data received at the data input circuit 340 to be transmitted out by the data output circuit 370. The init counter 346 is set to count for approximately 1.0234 milliseconds (approximately 1.3 microseconds times the number of frames 788). The bit counter decoder 348 is set to decode a count of 226 bits. The frame counter decoder 350 is set to decode 788 frames. The control logic 390 includes addition counters to implement the state machines to provide timing and signalling conventions of the configuration protocol.

In one embodiment, the configuration protocol emulation logic 240 includes a multiple single mode configuration protocol emulation logic blocks 320 for all of the configuration modes of the XC4000 FPGA family. This embodiment allows the MPIC 150 to be interchanged with the PLD 140 regardless of the configuration mode used by the programming circuit 110.

In another embodiment, to save silicon area, only selected configuration modes are supported in the MPIC 150. Note that since each of the single mode configuration protocol emulation logic blocks is unique to its mode, some of the single mode emulation logic blocks will be larger than others. Consider, for example, the slave serial mode and the master parallel down mode in the XC4000 FPGA. The slave serial configuration emulation mode has a single serial path for the data between the data bus 131 and the data out bus 121. However, the same path for the master parallel down mode configuration emulation logic block has many additional elements because the data is eight bit parallel in and out. Thus, the master parallel down mode emulation logic block uses more silicon area than the slave serial emulation logic block.

A Merged Mode Configuration Emulation Circuit

Figure 4A:
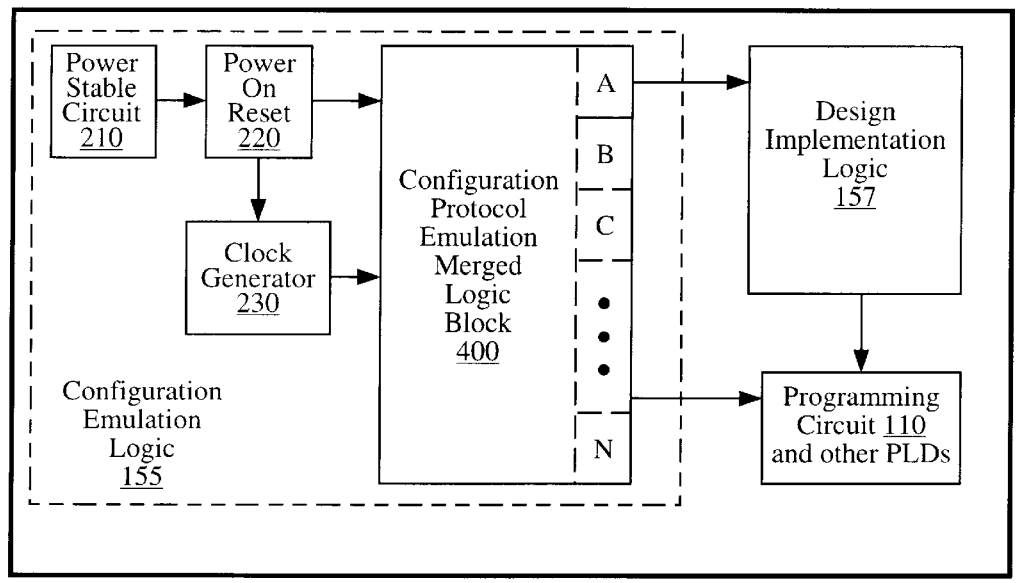
FIGS. 4A and 4B illustrate a merged mode configuration emulation circuit.
Figure 4B:
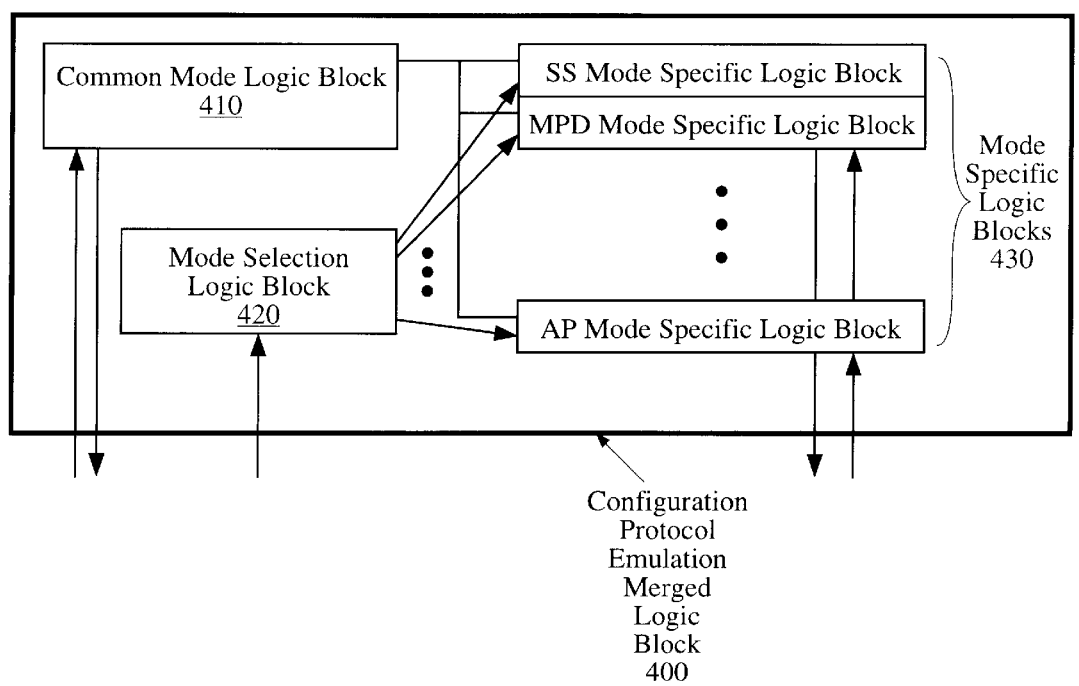

FIGS. 4A and 4B illustrate an embodiment that emulates multiple configuration modes of a PLD 140 using a configuration protocol emulation merged logic block 400. The merged logic block 400 replaces the multiplexed mode configuration protocol logic 240 of FIG. 3A.

The merged logic block 400 groups common logic functions of different configuration modes into a single common mode logic block 410. The merged logic block 400 includes a common mode logic block 410, a mode selection logic block 420, and a number of mode specific logic blocks 430. The common mode logic block 410 communicates with the mode specific logic blocks 430, the design implementation logic 157, the programming circuit 110 and other PLDs. The mode selection logic block 420 enables one of the mode specific logic blocks 430 in response to a specific configuration mode.

The merged logic block 400 also expands the function of the control logic 390 to support the common mode logic block and the specific mode logic blocks. The merged logic block 400 reduces the silicon area used to support an equivalent number of modes in the MPIC 150 of FIG. 3A by commonly sharing the resources required to emulate the configuration protocol relationship. For example, if the merged logic block 400 supports three configuration modes, substantial silicon area can be saved by sharing the bit counter 342, the frame counter 344 and the init counter 346 circuits in the common mode logic block 410.

In one embodiment, the mode specific logic blocks 430 include logic to emulate the following configuration modes: slave serial, master serial, master parallel up, master parallel down, asynchronous peripheral, and synchronous peripheral. In another embodiment, the mode specific logic blocks emulate the boundary scan, and express modes. In other embodiments, the mode specific logic blocks 430 emulate specific configuration timing relationship and protocol relationships during the init phase, the programming phase and the startup phase of the PLD 140. Also, as noted above, the merged logic block 400 can support a subset of the configuration modes of the PLD 140. For example, in one embodiment, the merged logic block 400 emulates slave serial and master serial modes. Thus, the mode specific logic blocks 430 includes only two mode specific logic blocks.

A multiple mode configuration emulation circuit and method have been described. One embodiment of the invention allows a mask programmed integrated circuit of a circuit design to emulate multiple configuration modes of a PLD. Thus, a designer can substitute the mask programmed integrated circuit into a system that used a PLD without having to redesign the system. In one embodiment, one of a number of single mode configuration emulation logic blocks are enabled based on signals received from a programming circuit. In another embodiment that also emulates multiple modes, logic that is common to the modes is shared to reduce the silicon area used by the emulation circuit.

I claim:

1. A circuit implemented in a mask-programmed technology, said circuit for emulating a configuration timing relationship and a configuration protocol relationship, said relationships existing between a Programmable Logic Device (PLD) and a programming circuit, said programming circuit using a configuration mode signal to said PLD to establish said configuration timing relationship and said configuration protocol relationship, said circuit comprising:
   a first circuit to emulate said PLD in said configuration timing relationship; and
   a second circuit to emulate said PLD in said configuration protocol relationship, said second circuit receiving said configuration mode signal, wherein said second circuit is responsive to said configuration mode signal.

2. The circuit of claim 1 wherein said first circuit includes a power stable circuit and a power on reset circuit, said power stable circuit indicating a stable power supply to said circuit, said power on reset circuit to reset said circuit responsive to said power stable circuit.

3. The circuit of claim 1 wherein said second circuit includes a plurality of single mode configuration protocol emulation circuits, each single mode configuration protocol emulation circuit for emulating a different configuration protocol relationship between said PLD and said programming circuit.

4. The circuit of claim 1 wherein said second circuit emulates multiple configuration protocol relationships between said PLD and said programming circuit, said second circuit including a plurality of configuration mode specific circuits and a first common logic block, each of said plurality of configuration mode specific circuits generating signals responsive to a specific configuration mode, said first common logic block including logic circuits shared by said plurality of configuration mode specific circuits.

* * * * *